(12) United States Patent
Hsieh et al.

(10) Patent No.: US 8,389,873 B2
(45) Date of Patent: Mar. 5, 2013

(54) ENCLOSURE OF ELECTRONIC DEVICE

(75) Inventors: Po-Chuan Hsieh, Taipei Hsien (TW);
Yu-Chang Pai, Taipei Hsien (TW);
Chien-Hung Liu, Taipei Hsien (TW);
Shou-Kuo Hsu, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 261 days.

(21) Appl. No.: 12/841,125

(22) Filed: Jul. 21, 2010

(65) Prior Publication Data

US 2011/0266046 A1    Nov. 3, 2011

(30) Foreign Application Priority Data

Apr. 30, 2010    (TW) .............................. 99113771 A

(51) Int. Cl.
*H05K 9/00* (2006.01)
*H02B 1/56* (2006.01)

(52) U.S. Cl. .................... 174/383; 454/184

(58) Field of Classification Search .............. 454/184; 174/383; 361/679.46; 156/80.3
See application file for complete search history.

(56) References Cited

U.S. PATENT DOCUMENTS

| 5,297,004 | A  | * | 3/1994  | Mazura .......................... 361/690 |
| 5,697,840 | A  | * | 12/1997 | Bainbridge et al. .......... 454/184 |
| 5,927,386 | A  | * | 7/1999  | Lin ................................ 165/80.3 |
| 5,928,076 | A  | * | 7/1999  | Clements et al. ............. 454/184 |
| 7,674,165 | B2 | * | 3/2010  | Lu et al. ........................ 454/184 |
| 7,796,376 | B2 | * | 9/2010  | Cairo et al. ................... 361/678 |
| 8,253,038 | B2 | * | 8/2012  | Pai et al. ....................... 174/383 |
| 2006/0148399 | A1 | * | 7/2006 | Su .................................. 454/184 |
| 2008/0006444 | A1 | * | 1/2008 | Cochrane ..................... 174/383 |
| 2009/0009961 | A1 | * | 1/2009 | Li .................................. 361/687 |

* cited by examiner

*Primary Examiner* — Hung Ngo

(74) *Attorney, Agent, or Firm* — Altis Law Group, Inc.

(57) ABSTRACT

An enclosure of an electronic device includes a plate. The plate defines a number of through holes. A number of shields extend from the plate corresponding to the through holes. Each shield extends outwards from the outer surface of the plate, surrounding and partly covering a corresponding through hole. The enclosure with the shields can shield the electronic device from EMI.

2 Claims, 3 Drawing Sheets

ENCLOSURE OF ELECTRONIC DEVICE

CROSS-REFERENCE TO RELATED APPLICATIONS

Relevant subject matter is disclosed in a co-pending U.S. patent application (application Ser. No. 12/849,939) having the same title, which is assigned to the same assignee as named herein.

BACKGROUND

1. Technical Field

The present disclosure relates to an enclosure of an electronic device.

2. Description of Related Art

For the enclosure of a typical electronic device, electromagnetic interference (EMI) is a common problem during operation. Commonly, through holes are defined in the enclosure for aiding in heat dissipation, and though sizes and placement of the holes are chosen and arranged to help avoid EMI, problems from EMI still occur.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
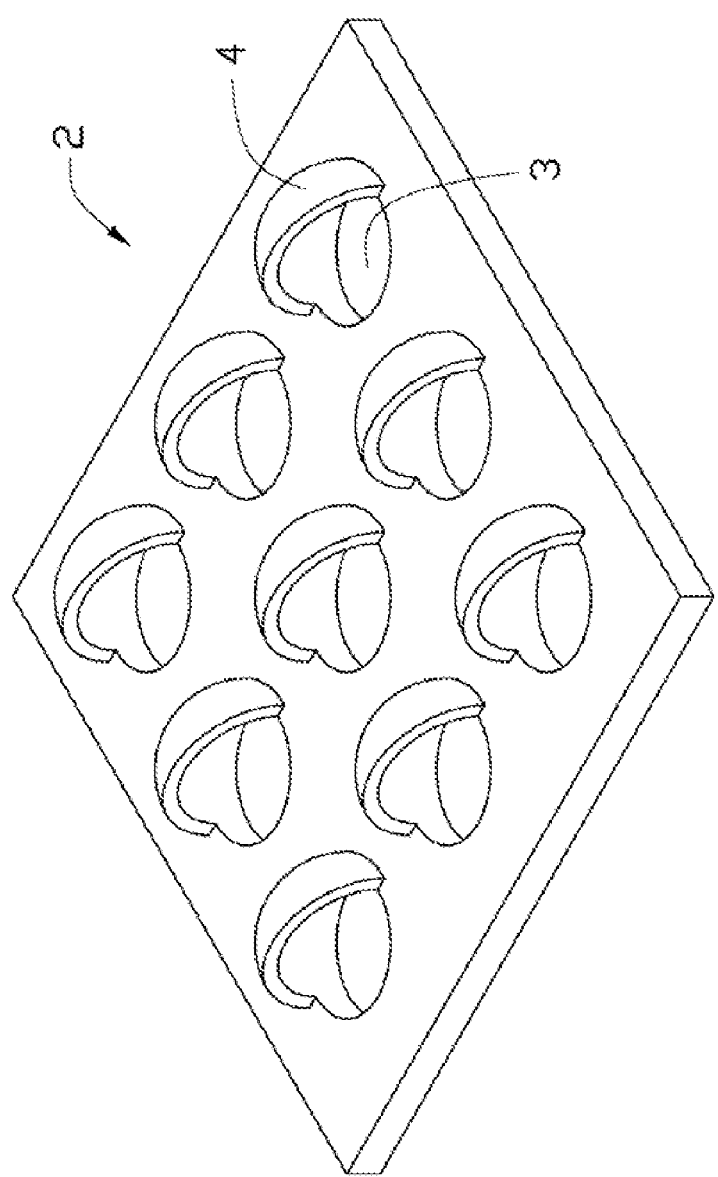
FIG. 1 is an isometric view of a plate in an exemplary embodiment of an enclosure of an electronic device.
Figure 2:
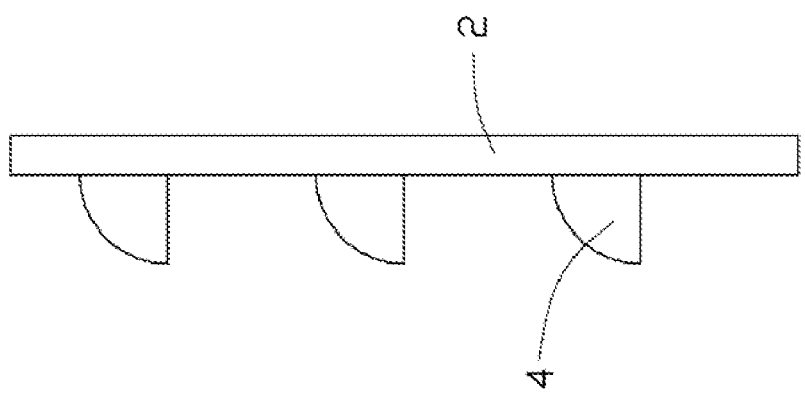
FIG. 2 is a side plan view of the plate of FIG. 1.

Referring to FIGS. 1 and 2, an exemplary embodiment of an enclosure of an electronic device includes a plate 2. The plate 2 can be arranged on a front side or a back side of the enclosure.

The plate 2 defines a plurality of through holes 3, with a plurality of shields 4 extending from the edges partially bounding the through holes 3 respectively. Each shield 4 is partially dome-shaped. In the present embodiment, each shield 4 is substantially shaped as a quarter of spherical surface. Each through hole 3 includes a first portion overhung by the shield 4, and a second portion not covered by the shield 4. In other words, each through hole 3 is partly overhung by the shield 4. As a result, heat inside the enclosure can be vented to the outside through the through holes 3.

Figure 3:
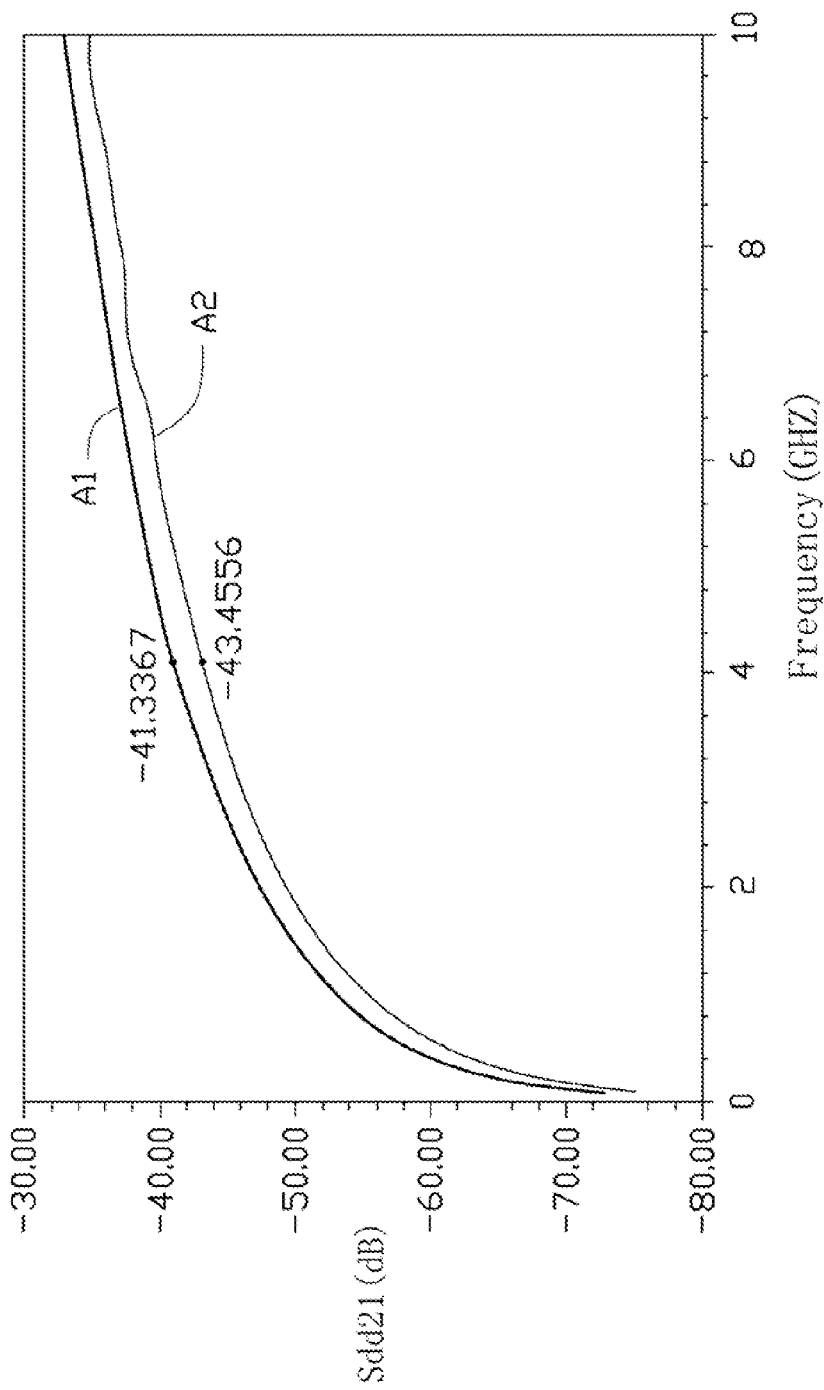
FIG. 3 is a graph showing EMI shielding effectiveness of a conventional enclosure and an enclosure using the plate of FIG. 1.

Referring to FIG. 3, a curve A1 represents EMI shielding effectiveness of a conventional enclosure. A curve A2 represents EMI shielding effectiveness of the enclosure with the plate 2 of FIG. 1. FIG. 3 clearly indicates that the EMI shielding effectiveness of the enclosure with the plate 2 is better than the EMI shielding effectiveness of the conventional enclosure.

In other embodiments, the size of the shield 4 can be changed according to need. When the shields 4 are configured with a different size, the EMI shielding effectiveness of the enclosure may be different. In addition, shape of the through holes 3 need not be round as shown in the figures.

The foregoing description of the embodiments of the disclosure has been presented only for the purposes of illustration and description and is not intended to be exhaustive or to limit the disclosure to the precise forms disclosed. Many modifications and variations are possible in light of the above everything. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. An enclosure comprising a plate, wherein the plate defines a plurality of round through holes, a plurality of electromagnetic interference (EMI) shields extend outwards from edges of the corresponding through holes, each through hole comprises a first portion overhung by the shield and a second portion not overhung by the shield, for heat dissipation and anti-EMI; and wherein each shield is substantially shaped as a quarter of spherical surface.

2. An enclosure comprising a plate, wherein the plate defines a plurality of round through holes, a plurality of electromagnetic interference (EMI) shields extend outwards from an outer surface of the plate corresponding to the through holes, each shield extends outwards from a part of an edge of a corresponding through hole and partly overhangs the corresponding through hole; and wherein each shield is substantially shaped as a quarter of spherical surface.

* * * * *